(12) United States Patent
Rouaissia et al.

(10) Patent No.: US 11,075,633 B2
(45) Date of Patent: Jul. 27, 2021

(54) WATER-REJECTION PROXIMITY DETECTOR AND METHOD

(71) Applicant: Semtech Corporation, Camarillo, CA (US)

(72) Inventors: Chaouki Rouaissia, Neuchâtel (CH); Sébastien Grisot, Boudry (CH)

(73) Assignee: Semtech Corporation, Camarillo, CA (US)

( * ) Notice: Subject to any disclaimer, the term of this patent is extended or adjusted under 35 U.S.C. 154(b) by 168 days.

(21) Appl. No.: 15/985,263

(22) Filed: May 21, 2018

(65) Prior Publication Data

US 2018/0358965 A1 Dec. 13, 2018

Related U.S. Application Data

(60) Provisional application No. 62/518,842, filed on Jun. 13, 2017.

(51) Int. Cl.
| | |
|---|---|
| *H03K 17/955* | (2006.01) |
| *G06F 3/041* | (2006.01) |
| *H03K 17/96* | (2006.01) |
| *G01B 7/02* | (2006.01) |
| *G06F 3/044* | (2006.01) |

(52) U.S. Cl.
CPC ........... *H03K 17/955* (2013.01); *G01B 7/023* (2013.01); *G06F 3/04186* (2019.05); *H03K 17/962* (2013.01); *G06F 3/044* (2013.01); *G06F 2203/04107* (2013.01); *G06F 2203/04108* (2013.01); *H03K 2217/960705* (2013.01); *H03K 2217/960765* (2013.01)

(58) Field of Classification Search
None
See application file for complete search history.

(56) References Cited

U.S. PATENT DOCUMENTS

| | | | | |
|---|---|---|---|---|
| 4,766,368 A | * | 8/1988 | Cox | G01D 5/2417 324/662 |
| 10,503,329 B2 | * | 12/2019 | Sleeman | G06F 3/0445 |
| 2008/0252474 A1 | * | 10/2008 | Nakamura | H03K 17/955 340/657 |
| 2010/0259283 A1 | * | 10/2010 | Togura | H03K 17/955 324/679 |
| 2011/0043227 A1 | * | 2/2011 | Pance | H03K 17/955 324/681 |
| 2013/0190057 A1 | * | 7/2013 | Sahu | G06F 1/1694 455/566 |
| 2017/0277328 A1 | * | 9/2017 | Kurasawa | G06F 3/0412 |

FOREIGN PATENT DOCUMENTS

EP 2876407 A1 5/2015

* cited by examiner

*Primary Examiner* — William Boddie
*Assistant Examiner* — Alecia D English
(74) *Attorney, Agent, or Firm* — Blank Rome LLP

(57) ABSTRACT

A proximity sensor, and a portable device equipped therewith, with at least two superposed sense electrodes, one partially screening the other. By reading the capacity first of one electrode, then of the other, while setting the potential of the counter-electrode either to ground or to guard, the sensor of the invention discriminates between a body part, or another electrically equivalent object, and water drops at closer distance.

10 Claims, 3 Drawing Sheets

WATER-REJECTION PROXIMITY DETECTOR AND METHOD

REFERENCE DATA

The present application claims benefit of provisional patent application U.S. 62/518,842, filed Jun. 13, 2017, the entire contents of which are hereby incorporated by reference.

FIELD OF THE INVENTION

The present invention concerns a proximity sensor and a method for detecting when a proximity is close to a body part of a user, rejecting the unwanted influence of water drops or other similar contaminations. Embodiments of the present invention concern in particular connected portable devices like cell phones tablets or laptops that, being equipped with the proximity sensor of the invention, are capable of determining with reliability when a user is close. A special but not exclusive embodiment is a portable connected device whose power of radio emission is adapted in consideration of the user's proximity, in order to limit the exposition to RF energy.

DESCRIPTION OF RELATED ART

It is often important to detect whether a body portion is at short distance of an apparatus. In particular in the case of connected portable devices, like cell phones tablets and laptops, this information is instrumental in several important functions like, limiting the absorbed dose of RF energy, or limiting the power consumption by shutting down the display when the phone is brought to the ear.

Another important function of proximity sensors is, in a portable phone, disabling the tactile screen when the user brings the phone to the ear. Without this, the user could inadvertently cut a call or trigger unwanted actions by touching the screen with his/her cheek or fingers.

Avoiding false detections is, however, equally important. Many proximity sensors used in portable phone exploit the changes in the capacity of an electrode in response to the approach of a body part. This technique is widely accepted because the sensor is a simple conductive electrode, easy to integrate on a printed circuit board. However it can give rise to false detection because conventional capacitive systems are incapable of discriminating between a large object at a certain distance, and a small one at closer distance.

Water, due to its large dielectric constant and conductivity is a source of special concern. A thin film or some drops of water on the detector can change the capacity perceived by the electrode enough to generate a false proximity signal.

Other proximity detection techniques are available, for example based on optical detection, and can discriminate water in some cases. The drawbacks of these systems are however the power consumption, and the cost of the needed components and of their integration in the mobile device.

European patent application EP2876407, in the name of the applicant describes capacitive sensors that are read by means of charge amplifiers connected to a floating variable voltage reference. The same document describes the use of such sensors in touch-sensitive displays.

The present invention proposes a proximity detector that adds water discrimination to the favourable properties of capacitive systems.

BRIEF SUMMARY OF THE INVENTION

According to the invention, these aims are achieved by means of the object of the appended claims.

Although the invention is applicable to a large array of devices, for example laptops, tablets, e-readers, electronic measuring instruments, and also to non-portable devices, the present description will refer simply to a "mobile phone" for concision's sake. This should not be taken as a limiting feature of the invention though.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
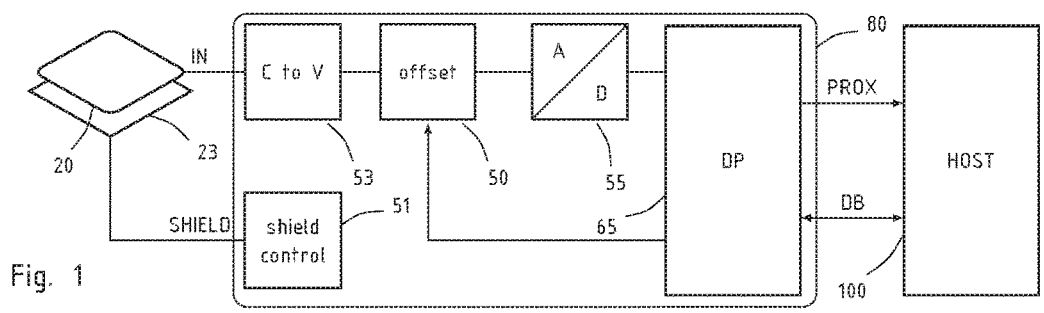
FIG. 1 shows schematically a capacitive proximity sensor as it could be used in a portable phone.
Figure 5:
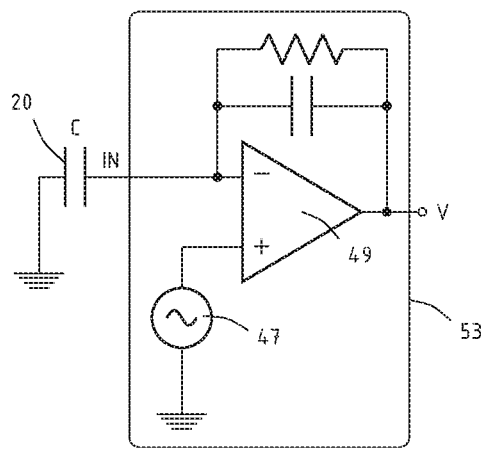
FIG. 5 is a simplified idealized circuit for converting capacity to voltage.

FIG. 1 shows schematically the structure of a capacity proximity detector, as it could be employed in the frame of the invention. The detector includes a sense electrode 20 connected to an input terminal IN for the determination of its capacity. The capacity of the electrode can be determined by applying a variable potential of determined amplitude V to the input terminal IN, integrating the input current to obtain the electric charge Q, which is related to the capacity by $C=Q/V$. The input potential can vary according a sinusoidal or square law, for example. FIG. 5 shows a simplified circuit that could be used for the purpose. The informed reader will recognize that the terminal IN is a low impedance node whose potential is the same, thanks to reaction, as the output of the voltage source 47, and that the output signal V has the same shape as that of the source 47, with an amplitude proportional to the capacity 20. For additional information, the reader is directed to patent application EP2876407, which is hereby incorporated by reference.

The capacitive sensor readout circuit 80 may include a capacity-to-voltage conversion unit 53, that generate a voltage signal proportional to the capacity seen by the electrode 20. This can be implemented by a charge amplifier having a virtual ground input tied to a variable reference potential, as described in EP2876407, but other circuits fulfilling the same function are available and comprised in the frame of the invention. The principle of operation of the capacitive sensor readout circuit 80 is that, the head and body of a user have a dielectric constant much higher than that of free space. Thus, when the user approaches the head or another body to the electrode, 20 its capacity increases by a tiny but measurable amount.

One difficulty of capacitive detection is that the capacity change determined by the proximity of the user is superposed to a large baseline value that is constant, or drifts slowly. The sensor of the invention includes preferably an offset subtraction unit 50 that is arranged to subtract a programmable value to the total capacity before it is converted to a digital value in the ADC 55, to enhance the proximity induced variations and utilize optimally the dynamic range of the latter.

In the drawing, the offset compensation unit 50 is represented as a separate block acting on an analogue signal generated by the capacity-to-voltage converter 53. Although this is a possible and favoured implementation, it is not the only one; the invention is not limited to this embodiment, and the blocs of the schematics 1 should be interpreted as functional elements rather than physically separated entities. In variants, the subtraction of the offset could be carried out in the capacity-to-voltage converter 53, or in the ADC 55. Also, if the proximity detector readout circuit 80 comprises several input channels, as it will be detailed further, the offset compensation could be done in independent units for each channel, or in a shared compensation circuit.

Another difficulty in capacitive proximity detectors is that the input electrode 20 can pick up all sort of signal and disturbances generated in its environment, including those coming from the phone in which it is embedded. Although such disturbances can be filtered by signal processing, it is preferable to attenuate them from the start. To this purpose, the detector can provide a shield electrode 23, below the sense electrode 20, in order to screen it from the electronics inside the phone. Preferably, the sense electrode is connected to the output terminal, of a shield control unit 51, which follows the variable potential of the input terminal IN. In this manner, the shield 23 does not contribute to the capacity seen by the electrode 20.

Digital processor 65 elaborates the digital signal generated by the ADC 55 and provides a proximity signal PROX based on the capacity of the electrode 20. It is in communication with a host system, for example a mobile phone through a bus DB, and can be implemented by any form of wired or programmable logic. The digital processor 65 takes care of function like fine offset subtraction, noise filtering, and implements a decision algorithm that asserts the PROX signal when the capacity read at the input IN is compatible with a part of a user's body in proximity.

Although FIG. 1 represents only one input terminal, the sensor of the invention is not so limited, as it will be clear in the following.

Figure 2:
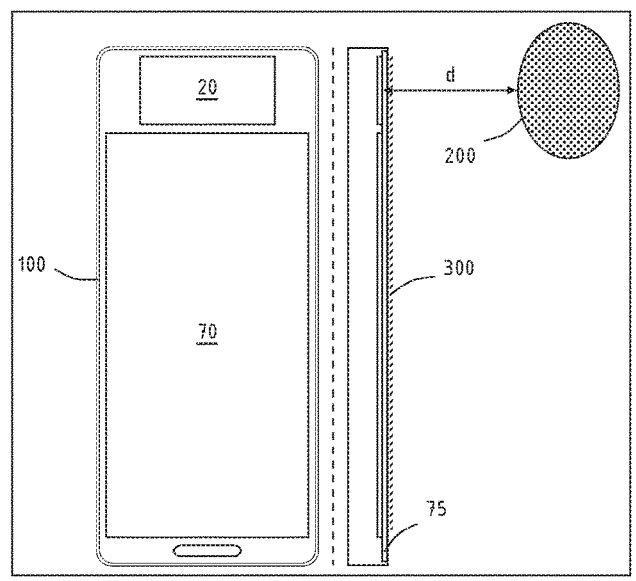
FIG. 2 shows a portable phone with a capacitive sensor in relation to a body part and to a water film, and FIG. 3 plots the capacity signals expected from the approach of the body part and from the water film.
Figure 3:
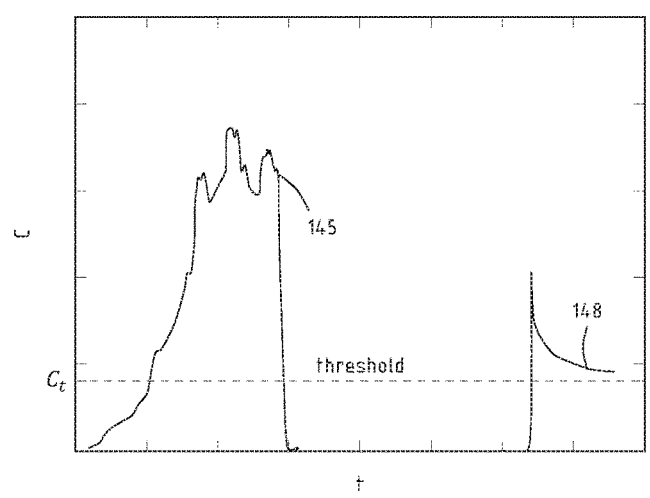

FIGS. 2 and 3 illustrate the problem arising in capacitive proximity detection when the device is exposed to water in drops or films. The portable phone 100 is represented from the face and from one side, and the capacity sensor 20 is placed above the display 70, preferably close to the phone loudspeaker, that is often the spot that the user brings close to the ear. Preferably, the sense electrode 20 and the display are covered by a transparent and dielectric protective layer 75, for example a thin glass plate. Although not represented, the electrode 20 may be part of the RF antenna, or close thereto, which is favourable if the proximity signal is used for compliance to SAR limits.

As seen in the right part of FIG. 2, the capacity of electrode 20 may change either because a user moves a body part 200 at a sufficiently close distance d from the sensor electrode, or due to water 300 on the surface of the phone in the form of drops or films. Although the amount of water may be little, it can contribute considerably to the capacity of the electrode 20 because of its close distance and high permittivity.

FIG. 3 exemplifies the situation. It is a plot of the capacity of the electrode 20 as a function of time. The left part of the plot shows the change in capacity 145 corresponding to a user bringing the head close to the loudspeaker. The right part 148 plots the change expected when a drop of water falls on the glass directly above the electrode 20. As it can be appreciated, the contribution of water, although smaller, cannot be clearly separated by a sensible choice of the threshold $C_r$.

Figure 4:
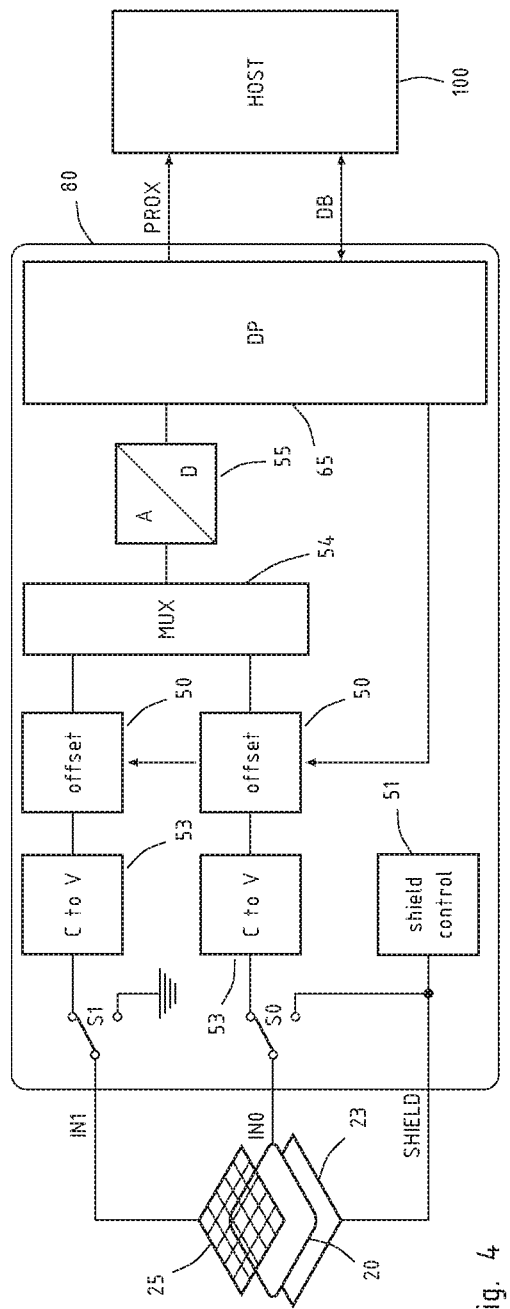
FIG. 4 illustrates schematically an advanced multichannel capacitive sensor.

FIG. 4 illustrates an advanced capacitive sensor according to an aspect of the invention. The sensor has a plurality of capacity input, two of which, S0 and S1, are represented. The multiplication of the inputs could be obtained by simply repeating the single input structure of FIG. 1, or in a multiplexed architecture where some components or functions are shared between the inputs. In the example drawn, two inputs IN0, IN1 have independent capacity-to-voltage converters 53 and offset compensation 50, and the offset-subtracted signals are digitized by a common ADC 55 through a multiplexer 54. Other architectures are possible, however.

The two inputs S0 and S1 are connected to two sense electrodes. A main electrode 25 faces directly the sense region, that is the outer region adjacent to the face of the phone, and a reference electrode 20 is behind the main electrode, the main electrode 25 screening at least in part the reference electrode 20.

The reference electrode may be for example a solid conductive pad, and the main may have any structure that leads to a partial screening. Good results have been obtained by patterning the main electrode as a conductive grid or as an array of conductive stripes separated by dielectric, both with a pitch comprised between 0.1 mm and 5 mm, but other structures are possible.

Preferably a shield electrode 23 is positioned below the reference electrode 20, as in the previous example but, again, this is not an essential feature.

Importantly, the inputs IN0, IN1 of the proximity sensor, which are connected on the outside to the reference electrode, respectively to the main one, can be processed by the capacity-to-voltage units 53, to read the capacity connected thereto, or else tied to a voltage of predetermined characteristics. In the drawing this function is represented by the switches S0, S1, but this is not an essential feature of the invention. If the capacity-to-voltage converter have a structure similar to that of FIG. 5, for example, the potential of the input terminal can be determined by the voltage source 47, without actual switching.

The action of the capacitive detector 89 combines two reading of capacity. The first capacity considered is that of the main electrode 25, measured while keeping the reference electrode 20 at the same potential as the main electrode 25 that is, connected as shield. The second capacity considered is that of the reference electrode 20, measured while keeping the potential of the main electrode 25 fixed, for example at ground potential as drawn.

Figure 6:
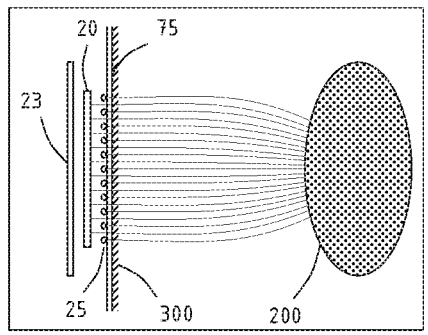
FIGS. 6 and 7 show two electric field distributions in the detector of FIG. 4.
Figure 7:
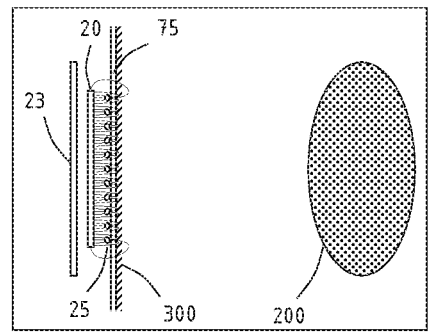

FIGS. 6 and 7 illustrate, by way of example, the electric field that may arise in these cases. It is important to realize that these drawings are not realistic simulations. In a real use case, the electric field will be distorted by the presence of many conductors and dielectrics in the phone, which are coupled with the main and reference electrodes 25, 20.

FIGS. 6 and 7 illustrate however that the two readings are characterized by radically different distributions of the electric field, such that elements that have a large weight in the first capacity could, according to their position, contribute little to the second, and inversely. This is true also in a real device, although the field distributions may differ considerably from the examples presented.

More in detail it can be seen how, in the situation of FIG. 6, the electric field lines extend beyond the main electrode 25, the glass 75 and the water layer 300, in the measure area, and reach the body part 200. It is expected therefore that the first capacity will be determined by the presence of the body part 200 and of the water 300, similarly as if the electrodes 20 and 25 were not split, since the field is similar to that of a simple flat electrode.

In the situation of FIG. 7, on the contrary, the electric field concentrates in the gap between the main electrode 25 and the reference electrode 20 overlapping, with decreased intensity, with the water film 300, and is expected to be fairly weak at the body part 200. Therefore, the presence of water 300 should weight more heavily, in the value of the second capacity than that of the body part 200.

Even if the electric field might be radically different in a real use case, still the two capacities, read while keeping the counter electrode either at the shield potential or at a fixed potential, explore different regions of the sensed volume, and this can be exploited to reject false proximity signals induced by water. It is important to keep in mind that the proximity sensor responds to the changes in capacity, induced for example when the phone is brought to the head, and not to their average values, which are subtracted by the offset compensation units 50, and preferably also by the digital processing that takes place in the processing unit 65.

Figure 8:
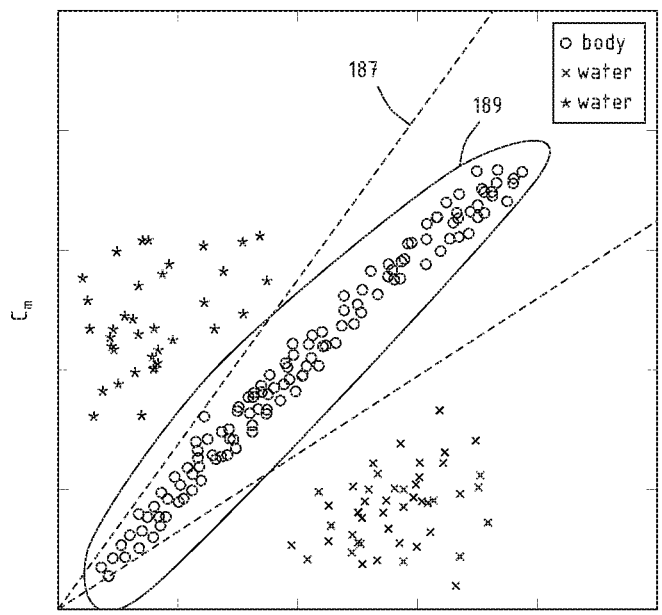
FIG. 8 is a scatter plot of the capacities read by the capacitive sensor in different configurations.

FIG. 8 plots the variation of the first capacity readout $C_m$ against the variation of the second capacity readout $C_r$, from a series of tests with the capacitive proximity sensor of the invention in portable devices. Round markers correspond to a body part approaching the mobile device, cross and star markers correspond to water drops or water splashes in different configurations.

As it can be seen, when a body part approaches the phone, the first and second capacity readout group approximately along a line, indicating that, even the absolute readout values vary according to the proximity of the part, its size, and so on, the ratio between $C_m/C_r$ changes little.

Water-induced detections, on the other side, tend to be more scattered and were preferably below the genuine events in some devices (crosses), or above them in other devices (stars). The ratio $C_m/C_r$ is different from the water events, and they tend to be more scattered.

The digital processor 65 is operatively arranged to generate a proximity signal based on the first capacity $C_m$ and on the second capacity $C_r$. This can be achieved by choosing a strategy that includes essentially all the genuine approaches (circles), and reject at least a large part of the water-induced signals (crosses and stars). For example, the PROX signal could be asserted when the first capacity and the second capacity, taken as coordinates in a two dimensional plane, locate a point inside a predefined acceptance region (contour 189), or when the ratio $C_m/C_r$ lies in a predetermined interval (wedge 187), or by another suitable selection algorithm based on $C_m$ and $C_r$.

Although the present description shows only one main electrode and one reference electrode, the former partially screening the latter from the detection volume, the invention is not limited to one pair. Indeed a portable device could include several capacitive sensors as depicted in FIG. 4, or the capacitive sensor readout circuit 80 could have more than two inputs to read a plurality of pairs of electrodes, each comprising one main electrode and one reference electrode as disclosed above, some electrode screening partially some other electrode from the measure volume.

The capacitive sensor readout circuit 80 could read its inputs in sequence, while keeping the inactive input either at ground or at guard potential, as in the above example and, by combining readings from a plurality of electrodes at different positions on the phone, provide additional information on the approaching body, for example its direction relative to the phone, while discriminating water as disclosed.

The invention claimed is:

1. A proximity sensor for a portable device, the sensor being arranged for detecting proximity of a body portion to the portable device, and for rejecting water or contaminants, comprising: one main electrode facing the outside of the portable device; one reference electrode behind the main electrode, whereby the main electrode screens partially the reference electrode from the outside of the portable device; a readout circuit operatively arranged for acquiring a first capacity of the main electrode by applying a same potential to the main electrode and to the reference electrode, and for acquiring a second capacity of the reference electrode while keeping the main electrode at a fixed potential, and a decision unit arranged to generate a proximity signal based on said first capacity and second capacity, wherein said reference electrode is a conductive pad, and said main electrode is a conductive grid or an array of stripes superposed to the reference electrode.

2. The proximity sensor of claim 1, wherein a pitch of said grid or of said array of stripes is comprised between 0.1 mm and 5 mm.

3. The proximity sensor of claim 1, wherein the decision unit is operatively arranged to generate a proximity signal when the first capacity and the second capacity, taken as coordinates in a two-dimensional plane, locate a point inside a predefined acceptance region.

4. The proximity sensor of claim 1, wherein the decision unit is operatively arranged to generate a proximity signal when a ratio between the first capacity and the second capacity, lies in a predetermined interval.

5. The proximity sensor of claim 1, comprising a charge to voltage converter, arranged for generating a voltage level proportional to said first capacity and/or second capacity, an offset subtraction unit operatively arranged to subtract a first programmable offset level from said voltage level, an analogue to digital converter, and a digital processor programmed to generate a proximity signal based on said first capacity value and said second capacity value as decision unit.

6. A proximity sensor for a portable device, the sensor being arranged for detecting proximity of a body portion to the portable device, and for rejecting water or contaminants, comprising: one main electrode facing the outside of the portable device; one reference electrode behind the main electrode, whereby the main electrode screens partially the reference electrode from the outside of the portable device; a readout circuit operatively arranged for acquiring a first capacity of the main electrode by applying a same potential to the main electrode and to the reference electrode, and for acquiring a second capacity of the reference electrode while keeping the main electrode at a fixed potential, and a decision unit arranged to generate a proximity signal based on said first capacity and second capacity; and a screen electrode below the reference electrode, the readout circuit being arranged to keep the screen electrode at the electric potential of the reference electrode.

7. A portable device including a proximity sensor arranged for detecting proximity of a body portion to the portable device, and for rejecting water or contaminants, comprising: one main electrode facing the outside of the portable device; one reference electrode behind the main electrode, whereby the main electrode screens partially the reference electrode from the outside of the portable device; a readout circuit operatively arranged for acquiring a first capacity of the main electrode by applying a same potential to the main electrode and to the reference electrode; and for acquiring a second capacity of the reference electrode while keeping the main electrode at a fixed potential, and a decision unit arranged to generate a proximity signal based on said first capacity and second capacity, wherein said reference electrode is a conductive pad, and said main electrode is a conductive grid or an array of stripes superposed to the reference electrode.

8. The portable device of claim 7, being arranged to reduce a level of radio emission or a screen brightness, or disabling a tactile input device based on said proximity signal.

9. The portable device of claim 7, being a mobile cellular phone, a wireless hand phone, a tablet, or a laptop.

10. The portable device of claim 7, wherein the proximity sensor comprises a plurality of pairs of electrodes, each pair having a main electrode and a reference electrode, wherein the main electrode screens partially the reference electrode from the outside of the portable device, the readout circuit being operatively arranged for acquiring a first capacity of any of the main electrodes by applying a same potential to the main electrode and to the corresponding reference electrode, and for acquiring a second capacity of any of the reference electrodes while keeping the corresponding main electrode at a fixed potential.

* * * * *